United States Patent
He et al.

(10) Patent No.: US 9,991,146 B2
(45) Date of Patent: Jun. 5, 2018

(54) DETECTION DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhongming He, Beijing (CN); Bin Cao, Beijing (CN); Sunggon Hong, Beijing (CN); Xiaogang Liu, Beijing (CN); Lingling Fan, Beijing (CN); Haisheng Liu, Beijing (CN); Jianye Song, Beijing (CN); Yan Zheng, Beijing (CN); Jinxing Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 392 days.

(21) Appl. No.: 14/744,573

(22) Filed: Jun. 19, 2015

(65) Prior Publication Data

US 2016/0260629 A1 Sep. 8, 2016

(30) Foreign Application Priority Data

Mar. 4, 2015 (CN) .......................... 2015 1 0096935

(51) Int. Cl.
*H01L 21/68* (2006.01)
*H01L 21/67* (2006.01)

(52) U.S. Cl.
CPC ...... *H01L 21/681* (2013.01); *H01L 21/67259* (2013.01)

(58) Field of Classification Search
CPC .................. H01L 21/67259; H01L 21/67265
See application file for complete search history.

(56) References Cited

U.S. PATENT DOCUMENTS 4,806,773 A 2/1989 Hiraga et al.
6,074,154 A * 6/2000 Ueda ................... G03F 7/70691
414/217

(Continued)

FOREIGN PATENT DOCUMENTS

CN 102721692 A 10/2012
CN 203012159 U 6/2013
(Continued)

OTHER PUBLICATIONS

First Office Action dated Jan. 13, 2017 in corresponding Chinese Application No. 201510096935.9.

*Primary Examiner* — Eric L Bolda
(74) *Attorney, Agent, or Firm* — Nath, Goldberg & Meyer; Joshua B. Goldberg

(57) ABSTRACT

The present invention provides a detection device for a cassette comprising at least one supporting unit, each supporting unit comprising a plurality of supporting brackets which constitute a supporting plane, wherein the detection device comprises a sensing mechanism for detecting whether position of each of the supporting brackets in each supporting unit is within a predetermined range. In the present invention, through detecting positions of the supporting brackets in the cassette, and then judging whether the positions of the supporting brackets in each supporting unit are in a preset range, a supporting unit in which there is one or more bracket supporting brackets whose positions are not in the preset range can be maintained in time, and therefore, damage to the glass substrate due to large error in positions of the supporting brackets can be prevented.

19 Claims, 3 Drawing Sheets

(56) References Cited

U.S. PATENT DOCUMENTS

2004/0213648 A1\* 10/2004 Hofmeister ....... H01L 21/67265
  414/217
2006/0087661 A1\* 4/2006 Miyajima ........... G03F 7/70741
  356/614

FOREIGN PATENT DOCUMENTS

| CN | 103412347 A | | 11/2013 |
| CN | 203858376 U | | 10/2014 |
| JP | 11024057 | \* | 1/1999 |
| JP | 2002-261152 | \* | 2/2001 |

\* cited by examiner

DETECTION DEVICE

FIELD OF THE INVENTION

The present invention relates to the field of manufacturing a display panel, and particularly to a detection device for a substrate cassette.

BACKGROUND OF THE INVENTION

During a production process of a display panel, a glass substrate as a base is transferred many times between various separated production devices due to the complicated process and too many manufacturing steps. In an actual manufacturing process, a cassette for carrying a plurality of glass substrates is usually used as a carrying device for storing and transferring the glass substrate. Therefore, quality and specification standards of the substrate cassette become key factors ensuring stable placing and picking of the glass substrate.

During the production process, if supporting brackets in the substrate cassette are not horizontal or errors in relative positions thereof are large, it is likely to cause damage to the glass substrate. However, in the prior art, there has not been a device for detecting the positions of the supporting brackets in the substrate cassette yet.

SUMMARY OF THE INVENTION

An object of the present invention is to provide a detection device for a substrate cassette, which is used to detect positions of the supporting brackets in the substrate cassette.

To solve the above problems, the present invention provides a detection device for a cassette comprising at least one supporting unit, each supporting unit comprising a plurality of supporting brackets which constitute a supporting plane, wherein the detection device comprises a sensing mechanism for detecting whether position of each of the supporting brackets in each supporting unit is within a predetermined range.

Preferably, the cassette comprises more than one supporting units, which are stacked in an up-down direction with a space therebetween, the sensing mechanism comprises a plurality of sensors which are in one-to-one correspondence with free ends of the supporting brackets in a supporting unit, and the plurality of sensors can move in a direction in which the supporting units are stacked, so as to sequentially detect position data of the free ends of the respective supporting brackets in each supporting unit.

Preferably, the sensing mechanism further comprises a data processor and a storage, the storage stores therein preset values and an error range of position data of the supporting brackets to be detected by the sensors, the data processor is used to compare position data measured by the sensors and the preset values respectively, and judge whether differences between the position data measured by the sensors and the preset values are within the error range.

Preferably, the sensing mechanism further comprises an alarm unit, and when the data processor judges that the difference between the position data measured by the sensor and the preset value is not within the error range, the data processor transmits an abnormal signal to the alarm unit, and the alarm unit sends out an alarm signal after receiving the abnormal signal.

Preferably, the detection device further comprises a mounting base which is capable of moving along the direction in which the supporting units are stacked, and all the sensors in the sensing mechanism are mounted to the mounting base.

Preferably, the cassette is used to carry a substrate, and has an opening side for placing and picking the substrate, each supporting unit comprises a plurality of end supporting brackets extending from two opposite sides adjacent to the opening side and at least one central supporting bracket extending from an side opposite to the opening side, the mounting base comprises two first mounting rods and a second mounting rod connected to the two first mounting rods, the two first mounting rods correspond to the two sides of the cassette respectively, each of the first mounting rods is provided with sensors in one-to-one correspondence with the end supporting brackets, and the second mounting rod is provided with sensors in one-to-one correspondence with the central supporting brackets.

Preferably, the sensor is an optical sensor and comprises a laser emitting element and a laser receiving element provided opposite to the laser emitting element, the laser emitting element is used to emit a laser for detecting the free end of the supporting bracket, the laser receiving element is used to receive the laser emitted from the laser emitting element, when the sensor is lift to a height of the free end of a corresponding supporting bracket, the free end of the supporting bracket is located between the laser emitting element and the laser receiving element, so that the laser receiving element cannot receive the laser emitted from the laser emitting element, when failing to receive the laser emitted from the laser emitting element, the laser receiving element generates and transmits a sensing signal to the data processor, and the data processor is capable of calculating the height of the detected supporting bracket based on time when the sensing signal is received, and compares the height with the preset value.

Preferably, the detection device further comprises a first drive mechanism and a guide rail, wherein the guide rail is provided along the direction in which the supporting units are stacked, the mounting base is slidably provided on the guide rail, and the first drive mechanism is used for driving the mounting base to move along the guide rail.

Preferably, the detection device further comprises a transfer mechanism, wherein the transfer mechanism comprises drive wheels provided at the bottom of the detection device, guide wheels provided at two sides of the drive wheel, and a second drive mechanism for driving the drive wheel to rotate, the drive wheels are used to transfer and carry the cassette, and the guide wheels are used to define transfer direction of the cassette.

Preferably, the detection device further comprises a positioning mechanism for fixing the cassette at a predetermined position.

Preferably, the positioning mechanism comprises a position sensor and a fastening component, the position sensor is used to detect whether the cassette is at the predetermined position, and when the cassette is at the predetermined position, the position sensor transmits a signal to the fastening component so as to control the fastening component to fix the cassette at the predetermined position.

Preferably, the detection device further comprises a programmable logic controller, which has a first control signal output terminal connected to the first drive mechanism and a second control signal output terminal connected to the second drive mechanism.

In the present invention, through detecting positions of the supporting brackets in the cassette, and then judging whether the positions of the supporting brackets in each supporting unit are in a preset range, a supporting unit in which there is one or more bracket supporting brackets whose positions are not in the preset range can be maintained in time, and therefore, damage to the glass substrate due to large error in positions of the supporting brackets can be prevented. Furthermore, the present invention can effectively solve the problem that the cassette for carrying the substrate in the production line is always manually checked in the prior art, so that efficiency and accuracy of checking the cassette are increased, manpower is saved and the production efficiency is increased.

BRIEF DESCRIPTION OF THE DRAWINGS

Accompanying drawings are used to provide further understanding of the present invention, constitute a part of the specification, and are used to explain the present invention together with following embodiments, but not to limit the present invention, wherein.

DESCRIPTION OF REFERENCE NUMERALS

1: substrate cassette; 11: supporting bracket; 101: end supporting bracket; 102: central supporting bracket 21: sensor 211: laser emitting element; 212: laser receiving element; 3: mounting base; 31: first mounting rod; 32: second mounting rod; 4: guide rail; 5: chain; 6: driving wheel; 7: guide wheel; 8: positioning mechanism; 9: case; 91: transparent window.

DETAILED DESCRIPTION OF THE EMBODIMENTS

Embodiments will be described in detail below in conjunction with the accompanying drawings. It should be understood that, the embodiments described herein are only used to describe and explain the present invention, but not to limit the present invention.

Figure 1:
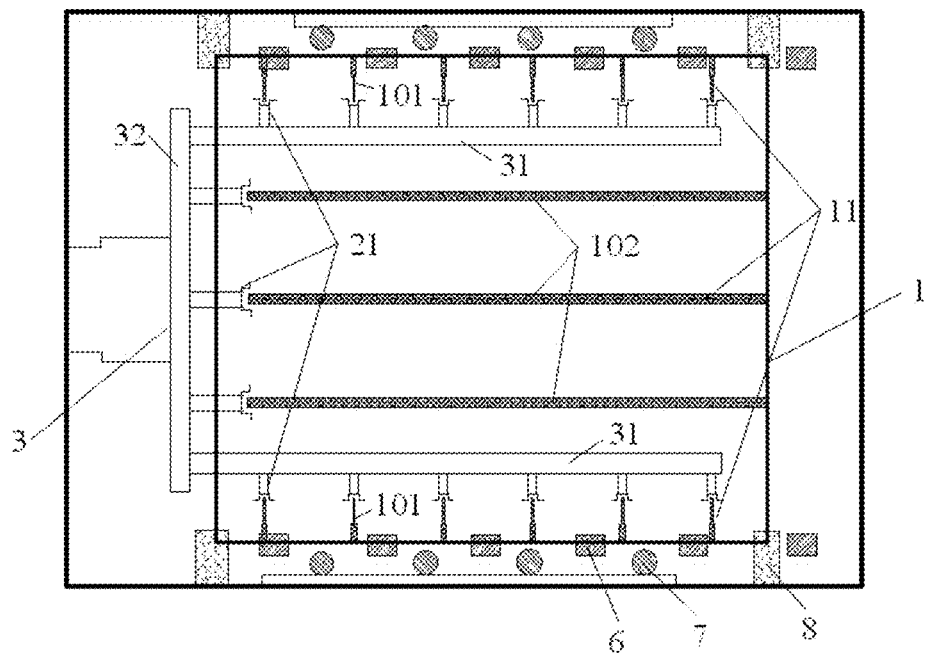
FIG. 1 is a top view of a detection device for a substrate cassette in an embodiment of the present invention.
Figure 2:
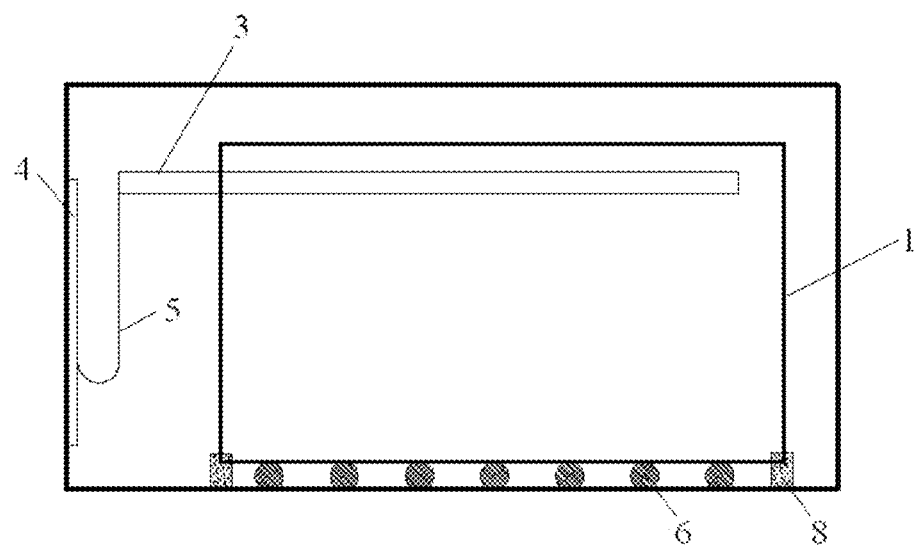
FIG. 2 is a side view of the detection device for a substrate cassette in the embodiment of the present invention.

FIG. 1 and FIG. 2 respectively show a top view and a side view of a detection device for a substrate cassette in an embodiment of the present invention, wherein the substrate cassette comprises at least one supporting unit, when there are a plurality of supporting units, they are stacked in an up-down direction with a space therebetween, each supporting unit comprising a plurality of supporting brackets which constitute a supporting plane for carrying a substrate, wherein the detection device for a substrate cassette comprises a sensing mechanism for detecting whether position of each of the supporting brackets in each supporting unit is within a predetermined range.

The sensing mechanism detects positions of the supporting brackets 11 in the substrate cassette 1, and then judges whether the positions of the supporting brackets 11 in each supporting unit are within a preset range, with respect to each supporting unit, if one of the positions of the supporting brackets 11 is detected to be not within the preset range, then this supporting unit is locked, so as to prevent damage to the glass substrate due to large position error of the supporting bracket 11. It should be noted that, the "this supporting unit being locked" refers to that, no glass substrate is transferred to this supporting unit any longer. The present invention can effectively solve the problem that the cassette for carrying the substrate in the production line is always manually checked in the prior art, so that efficiency and accuracy of checking the cassette are increased, manpower is saved and the production efficiency is increased.

Specifically, the sensing mechanism comprises a plurality of sensors 21 which are in one-to-one correspondence with free ends of the supporting brackets 11 in a supporting unit, and the sensors 21 can move in a direction in which the supporting units are staked, so as to sequentially detect position data of the free ends of the respective supporting brackets 11 in each supporting unit. The "free end" herein refers to one end of the supporting bracket 11 not being connected with an outer frame of the substrate cassette 1, that is, one suspended end.

Furthermore, the sensing mechanism further comprises a data processor and a storage, the storage stores therein preset values and an error range of position data of the supporting brackets 11 to be detected by the sensors 21, the data processor is used to compare position data measured by the sensors 21 and the preset values respectively, and judge whether differences between the position data measured by the sensors 21 and the preset values are within the error range.

Preferably, the sensing mechanism further comprises an alarm unit, when the data processor judges that the difference between the position data measured by the sensor 21 and the preset value is not within the error range, the data processor transmits an abnormal signal to the alarm unit, and the alarm unit sends out an alarm signal after receiving the abnormal signal, to remind the operator to deal with.

Taking a substrate cassette with an overall dimension of 2660 mm (L)×2390 mm(W)×1433 mm(H) as an example, the substrate cassette normally comprises 20 supporting units, and a position error range of the supporting bracket is set to ±8 mm. If the position error for every supporting bracket in the currently detected supporting unit is within the above error range, then this currently detected supporting unit is qualified. If position errors of one or more supporting brackets in the currently detected supporting unit are beyond the above error range, then the alarm unit sends out an alarm signal, and at the same time, makes a mark in the storage that this supporting unit is prohibited to be used, until it is maintained and unlocked. Meanwhile, position data of the supporting brackets in each supporting unit may be recorded in the storage so as to be referred to later.

Figure 3:
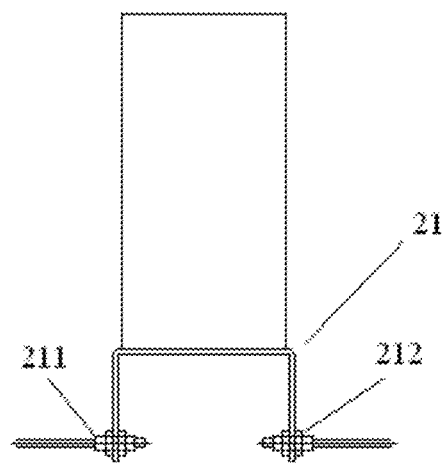
FIG. 3 is a diagram of a sensor in an embodiment of the present invention.

In the present invention, the sensor 21 may be an optical sensor. As shown in FIG. 3, the sensor 21 comprises a laser emitting element 211 and a laser receiving element 212 provided opposite to the laser emitting element 211, the laser emitting element 211 is used to emit a laser for detecting the free end of the supporting bracket 11, the laser receiving element 212 is used to receive the laser emitted from the laser emitting element 211. When the sensor 21 is lift to a height of the free end of a corresponding supporting bracket 11, the free end of the supporting bracket 11 is located between the laser emitting element 211 and the laser receiving element 212, so that the laser receiving element 212 cannot receive the laser emitted from the laser emitting element 211, when failing to receive the laser emitted from the laser emitting element 211, the laser receiving element 212 generates and transmits a sensing signal to the data processor, and the data processor is capable of calculating the height of the detected supporting bracket 11 based on time when the sensing signal is received, and compares the height with the preset value.

Furthermore, the detection device for the substrate cassette further comprises a mounting base 3 which is capable of moving along the direction in which the supporting units are stacked, and all the sensors 21 in the sensing mechanism are mounted to the mounting base 3. Therefore, as long as the mounting base 3 is driven to move along the direction in which the supporting units are stacked, the plurality of sensors 21 may move along the direction in which the supporting units are stacked. Generally, the mounting base 3 moves at a uniform speed upwards and downwards, when the substrate cassette with an overall dimension of 2660 mm (L)×2390 mm (W)×1433 mm (H) is detected, the mounting base 3 spends several seconds to move up or down, thus the whole detection process lasts several minutes. Compared to the manual detection, the preset invention saves time largely, and the production efficiency is increased.

Figure 4:
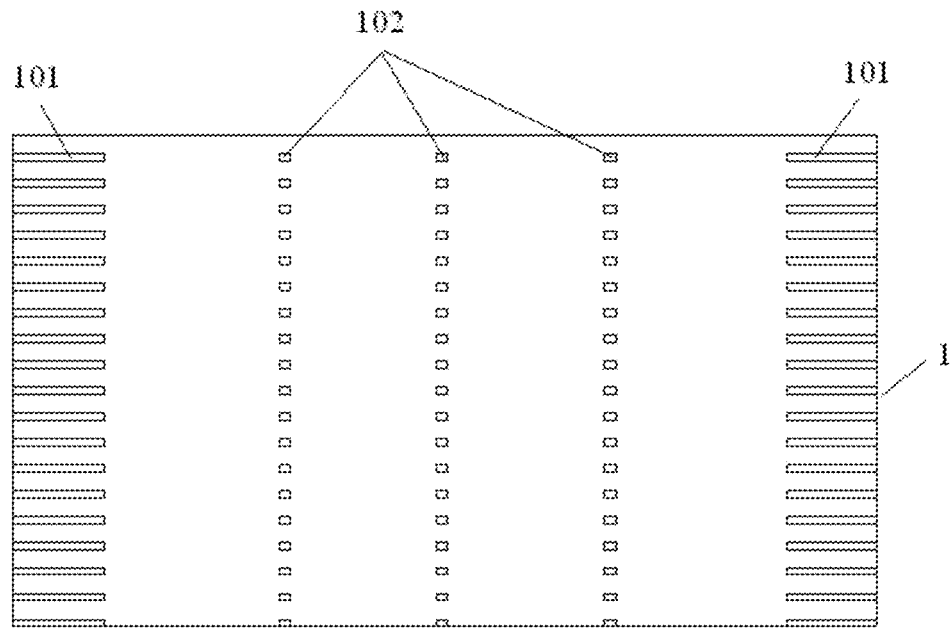
FIG. 4 is a front view of the substrate cassette in an embodiment of the present invention.

Specifically, FIG. 4 is a front view of the substrate cassette in an embodiment of the present invention, and in conjunction with the top view shown in FIG. 1, the substrate cassette 1 used to carry a substrate has an opening side for placing and picking the substrate, each supporting unit comprises a plurality of end supporting brackets 101 extending from two opposite sides adjacent to the opening side (there are six at each of two sides in FIG. 1) and at least one central supporting bracket 102 extending from an side opposite to the opening side (there are three in FIG. 1), the mounting base 3 comprises two first mounting rods 31 and a second mounting rod 32 connected to the two first mounting rods 31, the two first mounting rods 31 correspond to two sides of the substrate cassette 1 respectively, each of the first mounting rods 31 is provided with sensors 21 in one-to-one correspondence with the end supporting brackets 101, and the second mounting rod is provided with sensors 21 in one-to-one correspondence with the central supporting brackets 102.

In the present invention, the first mounting rods 31 and the second mounting rod 32 can enter inside the substrate cassette 1 to detect accurately, which may avoid interference with the substrate cassette 1 in structure design. In addition, when there are a large number of the supporting units in the substrate cassette 1, more first mounting rods 31 and more second mounting rods 32 may be provided at the mounting base 3, these first mounting rods 31 and second mounting rods 32 may be provided in an up-down direction with a certain interval therebetween, so as to detect a plurality of the supporting units at the same time, so that displacement of the sensor 21 may be reduced, thus detection efficiency is increased, and circulation period of the substrate cassette 1 in the detection device is reduced.

Furthermore, the detection device further comprises a first drive mechanism and a guide rail 4, as shown in FIG. 2, the guide rail 4 is provided along the direction in which the supporting units are stacked, the mounting base 3 is slidably provided on the guide rail 4. The so-called "slidably provided" refers to that the mounting base 3 may not only slide along the guide rail 4, but also be fixed at a predetermined position on the guide rail 4. The first drive mechanism is used for driving the mounting base 3 to move upwards and downwards along the guide rail 4, so as to detect the supporting brackets (not shown in FIG. 2) in each supporting unit. The first drive mechanism may comprise a servo motor.

In addition, the mounting base 3 may further connected to a chain 5, and move by the aid of the chain 5, so that load of the servo motor may be reduced.

A person skilled in the art should understand that, the first drive mechanism further comprises a transmission component, which is used to convert the rotation movement output from the servo motor into a linear movement. For example, the transmission component may comprise a gear and a rack, which are engaged with each other, the gear is fixed on the output shaft of the servo motor, and the rack is connected to the mounting base. Alternatively, the transmission component may comprise a piston, a cylinder of the piston is fixed on the mounting base, and a piston rod is connected to the mounting base 3, wherein the mounting base 3 is driven by stretch and contract of the piston rod to move along the guide rail 4.

Furthermore, the detection device for the substrate cassette further comprises a transfer mechanism, as shown in FIG. 1, the transfer mechanism comprises drive wheels 6 provided at the bottom of the detection device, guide wheels 7 provided at two sides of the drive wheel 6, and a second drive mechanism for driving the drive wheels 6 to rotate. The second drive mechanism may be a motor.

The drive wheels 6 are used to not only transfer the substrate cassette 1 to a position to be detected, but also carry the substrate cassette 1, which effectively save space, and increase the space utilization. The guide wheels 7 are used to define transfer direction of the substrate cassette 1, so as to decrease deviation of the substrate cassette 1 during its travel.

Furthermore, the detection device for the substrate cassette further comprises a positioning mechanism 8 for fixing the substrate cassette 1 at a predetermined position. The positioning mechanism 8 comprises a position sensor and a fastening component, the position sensor is used to detect whether the substrate cassette 1 is at the predetermined position, when the substrate cassette 1 is at the predetermined position, the position sensor transmits a signal to the fastening component so as to control the fastening component to fix the substrate cassette at the predetermined position.

Generally, the substrate cassette 1 may be reversed by a rotation mechanism, for example, after the substrate cassette 1 passes through a cleaning apparatus, the substrate cassette 1 is reversed by the rotation mechanism, and is transferred into the detection device for the substrate cassette by the above transfer mechanism, and the guide wheels 7 at the two sides are used to prevent position deviation of the substrate cassette 1 during the transfer procedure. The position sensor may determine position of the substrate cassette 1, when the substrate cassette 1 enters into the detection device for the substrate cassette, the position sensor transmits a signal to the fastening component and the fastening component fixes the substrate cassette 1 securely, so as to prevent its position deviation during examination.

Since slight swift of the substrate cassette 1 may be caused during the fastening component fixes the substrate cassette 1, if detection is conducted at this time, obtained data is likely to be inaccurate, therefore, a detection waiting time (300s in general) should be set, and when this period of time has lapsed, the substrate cassette 1 can be completely stable, and the supporting brackets therein are all in static state, and at this time, the mounting base 3 is driven to move upwards to start to detect.

Preferably, the detection device for the substrate cassette further comprises a programmable logic controller (PLC), which has a first control signal output terminal connected to the first drive mechanism and a second control signal output terminal connected to the second drive mechanism. The PLC outputs a first control signal for controlling the first drive mechanism to operation through the first control signal output terminal so as to realize entrance and departure of the substrate cassette 1. The PLC outputs a second control signal for controlling the second drive mechanism to operation through the second control signal output terminal so as to realize upwards and downwards movement of the mounting base 3.

Figure 5:
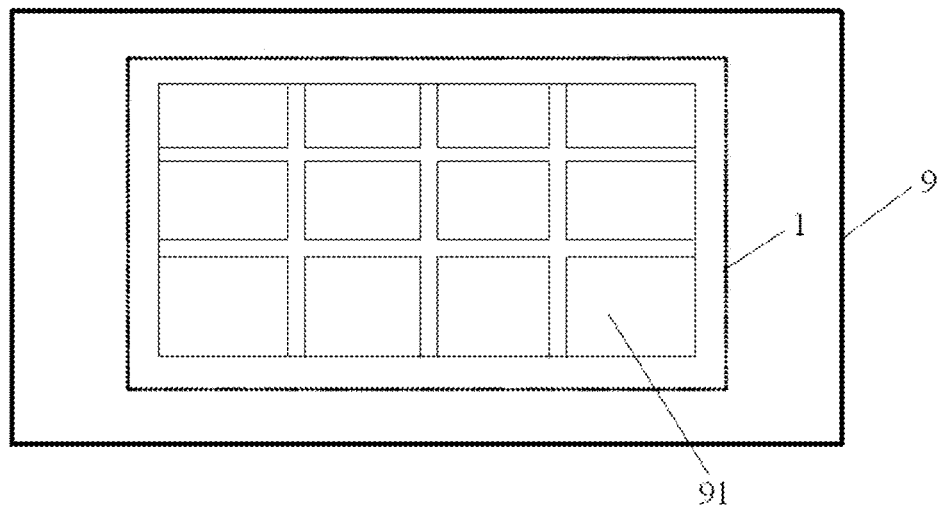
FIG. 5 is an appearance diagram of the detection device for the substrate cassette in an embodiment of the present invention.

FIG. 5 is an appearance diagram of the detection device for the substrate cassette in an embodiment of the present invention, the detection device for the substrate cassette further comprises a case 9 and a transparent window 91 provided in the case. The case 9 may be made of aluminum alloy, and the transparent window 91 may be made of plastic. In FIG. 5, position of the transparent window 91 corresponds to a position at which the corresponding substrate cassette 1 is located, which facilitates an operator to monitor the detection procedure of the substrate cassette 1 and handle abnormal condition in time.

Figure 6:
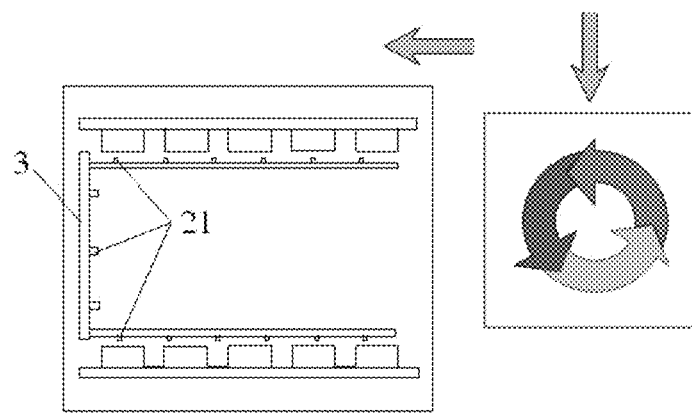
FIG. 6 is a diagram illustrating detection procedure of the detection device for the substrate cassette.

FIG. 6 is a diagram illustrating detection procedure of the detection device for the substrate cassette, arrows in this figure indicate movement direction of the substrate cassette, and a specific detection procedure is as follows:

a substrate cassette (not shown in FIG. 6) is transferred into the detection device for the substrate cassette by an upstream apparatus (such as a cleaning apparatus), so that the mounting base 3 provided with a plurality of sensors 21 stretches into the substrate cassette, the mounting base 3 is initially at the bottom of the substrate cassette, and sensors 21 on the mounting base 3 are in one-to-one correspondence with supporting brackets of the lowest supporting unit in the substrate cassette;

the mounting base 3 is driven to move upwards at a uniform speed from the bottom of the substrate cassette, so that the sensors 21 sequentially detect whether positions of corresponding supporting brackets are within the preset range respectively;

if positions of all of the supporting brackets in the currently detected supporting unit are in the preset range, then a next supporting unit is to be detected;

if positions of one or more supporting brackets in the currently detected supporting unit are beyond the preset range, then the currently detected supporting unit is marked and prohibited to be used, and an alarm signal is sent out so as to reminder the operator to maintain.

In the detection procedure, the detection device for the substrate cassette may record position information of each supporting bracket in each supporting unit simultaneously, and false information is recorded for an unqualified supporting unit so as to be referred to later.

In the present invention, the detection device for the substrate cassette detects positions of the supporting brackets in the substrate cassette, and then judges whether the positions of the supporting brackets in each supporting unit are in a preset range. In this manner, damage to the glass substrate due to large error in positions of the supporting brackets can be prevented. Furthermore, by the present invention, efficiency and accuracy of checking the cassette are increased, manpower is saved and the production efficiency is increased.

It should be understood that, the above embodiments are only exemplary embodiments used to explain the principle of the present invention and the protection scope of the present invention is not limited thereto. The person skilled in the art can make various variations and modifications without departing from the spirit and scope of the present invention, and these variations and modifications should be considered to belong to the protection scope of the invention.

The invention claimed is:

1. A detection device for a cassette comprising at least one supporting unit, each supporting unit comprising a plurality of supporting brackets which constitute a supporting plane, wherein the detection device comprises:
    a sensing mechanism for detecting whether position of each of the supporting brackets in each supporting unit is within a predetermined range, and the sensing mechanism comprises a plurality of sensors which are in one-to-one correspondence with free ends of the supporting brackets in a supporting unit, and
    a mounting base which is capable of moving along the direction that the supporting units are stacked, and all the sensors in the sensing mechanism are mounted to the mounting base.

2. The detection device of claim 1, wherein the cassette comprises more than one supporting units, which are stacked in an up-down direction with a space therebetween, and the plurality of sensors can move in a direction in which the supporting units are staked, so as to sequentially detect position data of the free ends of the respective supporting brackets in each supporting unit.

3. The detection device of claim 2, wherein the sensing mechanism further comprises a data processor and a storage, the storage stores therein preset values and an error range of position data of the supporting brackets to be detected by the sensors, the data processor is used to compare position data measured by the sensors and the preset values respectively, and judge whether differences between the position data measured by the sensors and the preset values are within the error range.

4. The detection device of claim 3, wherein the sensing mechanism further comprises an alarm unit, and when the data processor judges that the difference between the position data measured by the sensor and the preset value is not within the error range, the data processor transmits an abnormal signal to the alarm unit, and the alarm unit sends out an alarm signal after receiving the abnormal signal.

5. The detection device of claim 4, further comprising a mounting base which is capable of moving along the direction that the supporting units are stacked, and all the sensors in the sensing mechanism are mounted to the mounting base.

6. The detection device of claim 1, wherein the cassette is used to carry a substrate, and has an opening side for placing and picking the substrate, each supporting unit comprises a plurality of end supporting brackets extending from two opposite sides adjacent to the opening side and at least one central supporting bracket extending from an side opposite to the opening side, the mounting base comprises two first mounting rods and a second mounting rod connected to the two first mounting rods, the two first mounting rods correspond to the two sides of the cassette respectively, each of the first mounting rods is provided with sensors in one-to-one correspondence with the end supporting brackets, and the second mounting rod is provided with sensors in one-to-one correspondence with the central supporting brackets.

7. The detection device of claim 5, wherein the cassette is used to carry a substrate, and has an opening side for placing and picking the substrate, each supporting unit comprises a plurality of end supporting brackets extending from two opposite sides adjacent to the opening side and at least one central supporting bracket extending from an side opposite to the opening side, the mounting base comprises two first mounting rods and a second mounting rod connected to the two first mounting rods, the two first mounting rods correspond to the two sides of the cassette respectively, each of the first mounting rods is provided with sensors in one-to-one correspondence with the end supporting brackets, and the second mounting rod is provided with sensors in one-to-one correspondence with the central supporting brackets.

8. The detection device of claim 6, wherein the sensor is an optical sensor and comprises a laser emitting element and a laser receiving element provided opposite to the laser emitting element, the laser emitting element is used to emit a laser for detecting the free end of the supporting bracket, the laser receiving element is used to receive the laser emitted from the laser emitting element, when the sensor is lift to a height of the free end of a corresponding supporting bracket, the free end of the supporting bracket is located between the laser emitting element and the laser receiving element, so that the laser receiving element cannot receive the laser emitted from the laser emitting element, when failing to receive the laser emitted from the laser emitting element, the laser receiving element generates and transmits a sensing signal to the data processor, and the data processor is capable of calculating the height of the detected supporting bracket based on time when the sensing signal is received, and compares the height with the preset value.

9. The detection device of claim 7, wherein the sensor is an optical sensor and comprises a laser emitting element and a laser receiving element provided opposite to the laser emitting element, the laser emitting element is used to emit a laser for detecting the free end of the supporting bracket, the laser receiving element is used to receive the laser emitted from the laser emitting element, when the sensor is lift to a height of the free end of a corresponding supporting bracket, the free end of the supporting bracket is located between the laser emitting element and the laser receiving element, so that the laser receiving element cannot receive the laser emitted from the laser emitting element, when failing to receive the laser emitted from the laser emitting element, the laser receiving element generates and transmits a sensing signal to the data processor, and the data processor is capable of calculating the height of the detected supporting bracket based on time when the sensing signal is received, and compares the height with the preset value.

10. The detection device of claim 1, further comprising a first drive mechanism and a guide rail, wherein the guide rail is provided along the direction in which the supporting units are stacked, the mounting base is slidably provided on the guide rail, and the first drive mechanism is used for driving the mounting base to move along the guide rail.

11. The detection device of claim 5, further comprising a first drive mechanism and a guide rail, wherein the guide rail is provided along the direction in which the supporting units are stacked, the mounting base is slidably provided on the guide rail, and the first drive mechanism is used for driving the mounting base to move along the guide rail.

12. The detection device of claim 10, further comprising a transfer mechanism, wherein the transfer mechanism comprises drive wheels provided at the bottom of the detection device, guide wheels provided at two sides of the drive wheel, and a second drive mechanism for driving the drive wheels to rotate, the drive wheels are used to transfer and carry the cassette, and the guide wheels are used to define transfer direction of the cassette.

13. The detection device of claim 11, further comprising a transfer mechanism, wherein the transfer mechanism comprises drive wheels provided at the bottom of the detection device, guide wheels provided at two sides of the drive wheel, and a second drive mechanism for driving the drive wheels to rotate, the drive wheels are used to transfer and carry the cassette, and the guide wheels are used to define transfer direction of the cassette.

14. The detection device of claim 12, further comprising a positioning mechanism for fixing the cassette at a predetermined position.

15. The detection device of claim 13, further comprising a positioning mechanism for fixing the cassette at a predetermined position.

16. The detection device of claim 14, wherein the positioning mechanism comprises a position sensor and a fastening component, the position sensor is used to detect whether the cassette is at the predetermined position, and when the cassette is at the predetermined position, the position sensor transmits a signal to the fastening component so as to control the fastening component to fix the cassette at the predetermined position.

17. The detection device of claim 15, wherein the positioning mechanism comprises a position sensor and a fastening component, the position sensor is used to detect whether the cassette is at the predetermined position, and when the cassette is at the predetermined position, the position sensor transmits a signal to the fastening component so as to control the fastening component to fix the cassette at the predetermined position.

18. The detection device of claim 12, further comprising a programmable logic controller, which has a first control signal output terminal connected to the first drive mechanism and a second control signal output terminal connected to the second drive mechanism.

19. The detection device of claim 14, further comprising a programmable logic controller, which has a first control signal output terminal connected to the first drive mechanism and a second control signal output terminal connected to the second drive mechanism.

* * * * *